United States Patent [19]

Forge

[11] Patent Number: 5,097,229

[45] Date of Patent: Mar. 17, 1992

[54] MODULATOR - DEMODULATOR TRANSFORMER COUPLED D.C. TO ONE MHZ INFORMATION CHANNEL

[75] Inventor: Charles O. Forge, Los Altos, Calif.

[73] Assignee: Uniphase Corporation, San Jose, Calif.

[21] Appl. No.: 296,740

[22] Filed: Jan. 12, 1989

[51] Int. Cl.⁵ .......................... H03K 7/02; H03K 9/02
[52] U.S. Cl. .................................. 332/115; 324/118; 329/311; 330/10; 332/116
[58] Field of Search ............... 332/115, 116, 151, 152, 332/168, 172, 177, 178; 330/10; 328/21, 22; 324/118; 329/311

[56] References Cited

U.S. PATENT DOCUMENTS

| | | | |
|---|---|---|---|
| 2,854,633 | 9/1958 | DeJager | 332/9 R |
| 2,902,659 | 9/1959 | Ketchledge | 332/172 |
| 3,044,025 | 7/1962 | McCauley | 332/178 X |
| 3,187,269 | 6/1965 | Runyan | 331/74 |
| 3,614,668 | 10/1971 | Sudoh | 332/178 |
| 3,931,582 | 1/1976 | Kato et al. | 330/10 |
| 4,490,689 | 12/1984 | Jong | 331/116 |
| 4,758,941 | 7/1988 | Felton et al. | |

FOREIGN PATENT DOCUMENTS

| | | |
|---|---|---|
| 2121592 | 11/1972 | Fed. Rep. of Germany . |
| 3213857 | 11/1972 | Fed. Rep. of Germany . |
| WO/87/04038 | 7/1987 | World Int. Prop. O. . |

Primary Examiner—Siegfried H. Grimm
Attorney, Agent, or Firm—Skjerven, Morrill, MacPherson, Franklin & Friel

[57] ABSTRACT

An analog direct current to one MHz information channel is provided, with high acccuracy and 10K volt input-output isolation. The information channel has a voltage to current converter which receives the analog input signal, and whose output is modulated by a square wave generator and provided to a center tap of the primary winding of a transformer. On the output side, the secondary winding of the transformer provides the signal to a precision rectifier which recovers the analog input signal.

17 Claims, 5 Drawing Sheets

| FIG. 3a | FIG. 3b | FIG. 3c |

MODULATOR - DEMODULATOR TRANSFORMER COUPLED D.C. TO ONE MHZ INFORMATION CHANNEL

BACKGROUND OF THE INVENTION

1. Field of the Invention

This invention relates to a method and a device for providing a wideband low noise information channel with ten kilovolt input-output electrical isolation.

2. Description of the Prior Art

The prior art in this field includes the well known optoelectronic isolators whereby a photoelectric cell receives a light signal from a light emitting diode. Optoelectronic isolators have significant disadvantages in that they tend to electrically drift, i.e., their performance varies with ambient humidity, temperature, and time. In addition, the optoelectronic isolation technology is inherently nonlinear and has a limited bandwidth, so that such devices typically can only carry signals with a maximum frequency of about 300 KHz.

Another device known in the prior art is a conventional electrical transformer with a V/F (voltage to frequency) converter. In this technology, a low frequency analog signal is input to a voltage-to-frequency converter which produces a series of voltage pulses in which the spacing between pulses varies with the voltage of the input signal. The resulting pulses are put through a conventional transformer for isolation purposes and converted back to an analog signal by a frequency-to-voltage converter. This device also has a limited bandwidth and cannot carry signals with a frequency as high as one MHz.

A third known device includes a pulse width modulator (PWM) which accepts the input signal and transforms it into a constant frequency (i.e., A.C.) signal but with a duty factor proportional to the input signal. This signal from the PWM is put through a conventional transformer or an optoelectronic isolator, and then through a discriminator (i.e., demodulator) to recover the input signal. This device cannot carry an input signal having a frequency equal to the modulating frequency; the maximum bandwidth is about one third or one fourth of the modulating frequency, which is a significant disadvantage for carrying high frequency signals since providing a three or four MHz modulating frequency is difficult.

Therefore there is a need for an information channel with high accuracy and high bandwidth (up to one MHz) that provides good electrical isolation (i.e., protection) between the input and output terminals.

SUMMARY OF THE INVENTION

The object of the present invention is to provide a method and a device that is simple, carries a wideband signal, has low noise, is intrinsically accurate, has a very low time drift of the zero or gain, has no aliasing (i.e., presence of spurious frequency components within the output bandwidth) of frequency components of the input signal, and can carry a one MHz signal with full input-output electrical isolation.

In accordance with the present invention, a wideband current transformer is driven by a baseband analog current, whose direction is reversed periodically and suddenly by a modulated square wave. The baseband analog current is provided by a voltage to current converter that accepts an analog input signal at an input terminal and converts the signal to a current. The baseband current is modulated by the square wave before going through the current transformer. The secondary (output) winding of the transformer is connected to a precision rectifier which retrieves the analog input signal and provides the signal to an output terminal.

Thus, in accordance with the present invention, a method and device are provided to transmit an input analog signal through a current transformer, which serves as an electrical isolator, to a precision rectifier so as to get an exact replica at the output terminal (connected to the precision rectifier) of the analog signal provided to the input terminal

BRIEF DESCRIPTION OF THE FIGURES

FIG. 4 shows a block diagram of another embodiment of the invention.

DETAILED DESCRIPTION OF THE INVENTION

For simplicity, identical reference numbers in the various figures refer to similar or identical structures.

Figure 1:
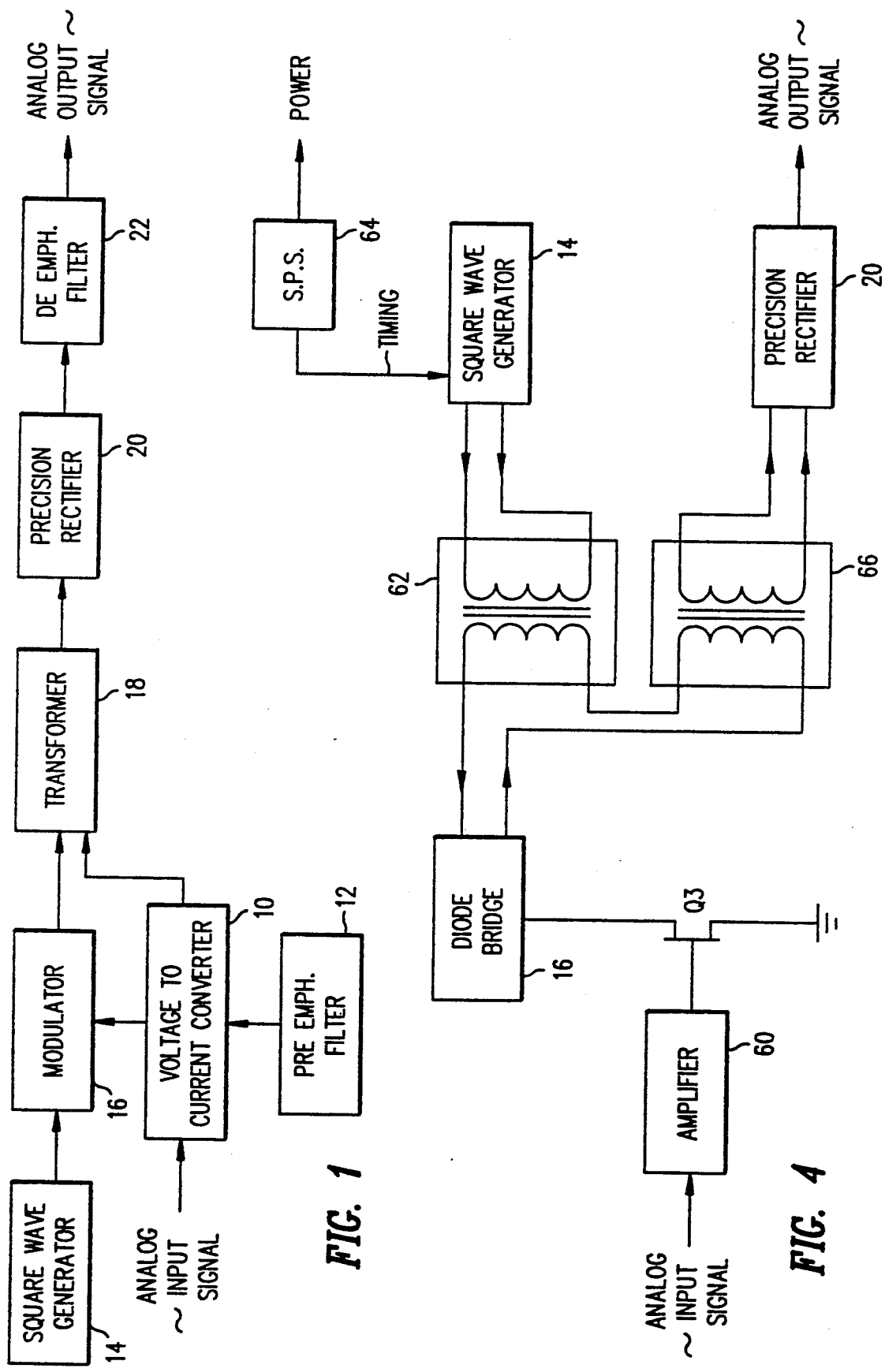
FIG. 1 shows a block diagram of the preferred embodiment of the present invention.

FIG. 1 is a block diagram showing the preferred embodiment of the present invention. The analog input signal is provided to a voltage to current converter 10, which preferably includes a conventional differential amplifier which drives a transistor (as discussed in detail below). A conventional preemphasis filter 12 is preferably connected to the voltage to current converter 10, for the purpose of providing increased gain to the high frequency components of the input signal. Preemphasis filter 12 is preferably an RC (resistor-capacitor) filter.

Square wave generator 14 provides square wave pulses with a preferred frequency of 1.4 MHz to conventional modulator 16, which modulates the square waves and provides them to the primary winding (not shown) of conventional electrical transformer 18, as is the output of voltage to current converter 10. The purpose of the square wave generator 14 and modulator 16 is to effectively ground one or the other end of the primary winding of transformer 18. The transformer 18 is effectively a current transformer in this circuit. As is known, a current transformer is capable of carrying wideband (i.e., high frequency) signals.

The current thus provided to the primary winding of transformer 18 conventionally induces current in the secondary winding (not shown) of transformer 18. The current in the secondary winding is provided to conventional precision rectifier 20, which in turn provides signals rectified from the current to conventional deemphasis filter 22, which has the purpose of attenuating high frequency noise introduced by the modulator or other sources.

The above described circuit modulates the input signal up to very close to one MHz if the square wave generator operates at one MHz, instead of only modulating the input signal to about 0.5 MHz as a prior art linear modulator would do.

The operation of the above described circuit is explained in greater detail as follows, with reference to FIG. 2. The component values and part numbers as described below are in accordance with the preferred embodiments; other embodiments will use other parts and values.

Figure 2:
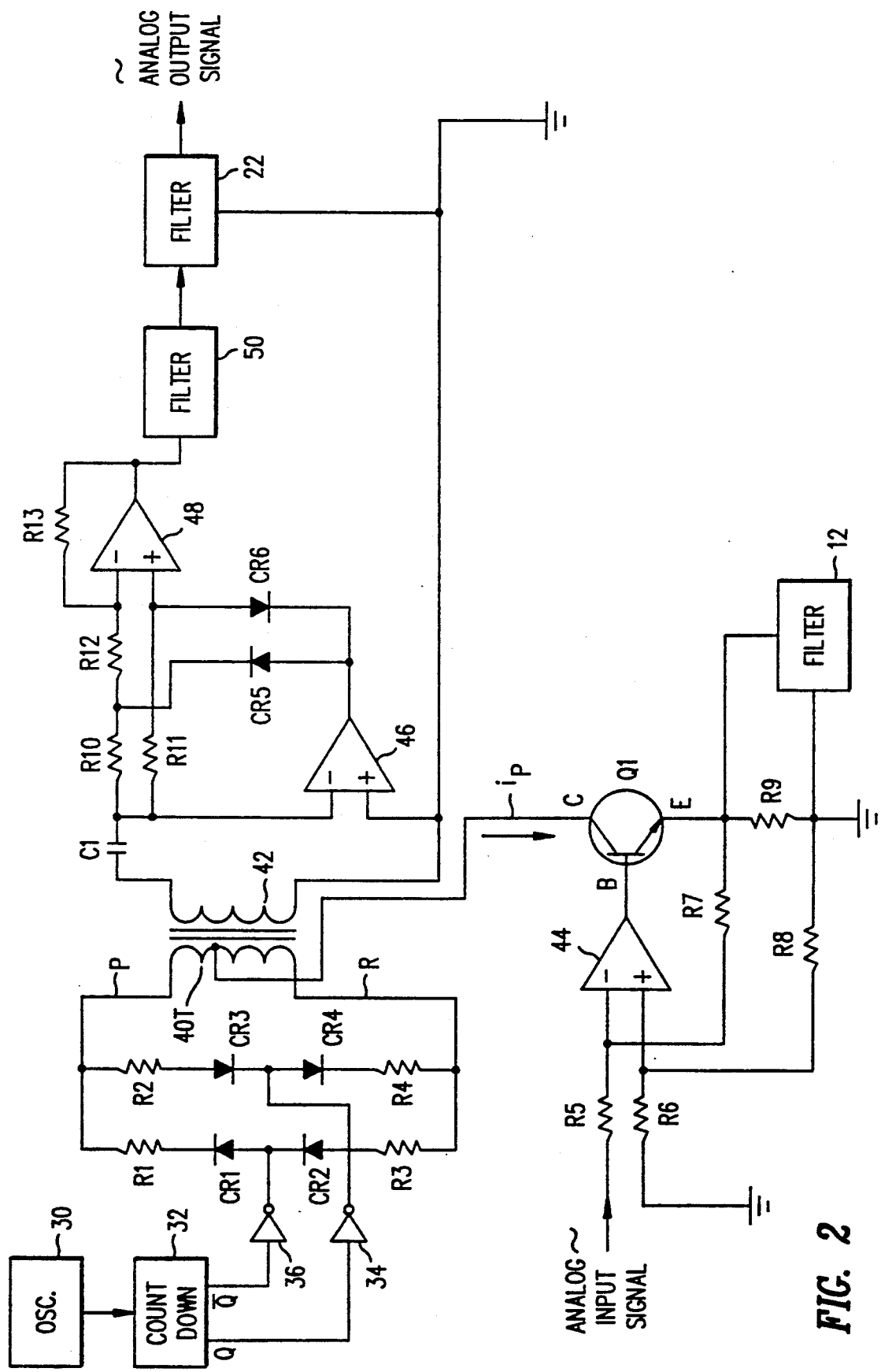
FIG. 2 shows a schematic of the preferred embodiment of the present invention.

The above described square wave generator 14 (see FIG. 1) includes a conventional 2.8 MHz oscillator 30 (see FIG. 2, preferably a commercially available integrated circuit, part no. LM C555CN) which drives a conventional 2:1 countdown device 32, preferably a commercially available integrated circuit, part no. 4013. Both oscillator 30 and countdown device 32 are preferably 15 volt CMOS devices. The combination of oscillator 30 and countdown device 32 conventionally generates a square waveform that has an exactly 50% duty factor, with output Q from countdown device 32 being on half the time and output $\overline{Q}$ being on the other half of the time. One half the time is one whole period of the oscillator 30, and the other half of the time is another whole period of the oscillator 30. The countdown device 32 provides, given a constant frequency from oscillator 30, a 50% duty cycle because one whole cycle of the oscillator 30 is half a cycle of the countdown device 32. The combination of the oscillator 30 and countdown device 32 is a known way to generate square waves.

The square waves so generated are provided to inverter 34 and inverter 36, and are switched between Q and $\overline{Q}$ at 1.4 MHz. Inverter 34 and inverter 36 preferably are both included in commercially available integrated circuit part no. CD 4049. The outputs Q and $\overline{Q}$ are the square waves and are provided to modulator 16 in FIG. 1 which preferably includes (see FIG. 2) diodes CR1, CR2, CR3, and CR4, which are a conventional diode bridge, as well as resistors R1, R2, R3 and R4 (each resistor is preferably 270 ohms) connected as shown.

The outputs from inverters 34 and 36 switch between zero and fourteen volts alternatively (i.e., when the output of inverter 34 is at 14 volts, the output of inverter 36 is at zero volts, and vice versa). When the output of the power inverter 36 is plus (i.e., at 14 volts), the top two diodes CR1 and CR3 are forward biased (i.e., do conduct current) and the bottom two diodes CR2 and CR4 are back biased (i.e., do not conduct current). Thus the point P at the top of the primary winding 40 of transformer 18 of FIG. 1 is at plus seven volts. Transformer 18 is preferably a custom transformer with four turns in primary winding 40 and ten turns in secondary winding 42 in FIG. 2. Transformer 18 preferably has a toroid core of ferrite. The core is Feroxcube Inc. part no. 845XT500-3E2A. The windings are mag wire no. 28HN. Mylar insulating tape insulates the toroid core. The transformer has a dipped epoxy coating. Point R is free to vary between zero and 14 volts because diodes CR2 and CR4 are back biased by that same voltage.

Thus during that half period, when the right hand side (diodes CR3, CR4, and resistors R2, R4) of the modulator 16 of FIG. 1 is at a plus voltage and the left hand side of the modulator (diodes CR1, CR2, and resistors R1, R3) is at a negative voltage, the current $i_p$ being drawn by current source transistor Q1 (preferably part no. 2N2222) flows up through the bottom of primary winding 40, flows upwards through primary winding 40 and down, as shown by the arrow next to $i_p$. The collector C of transistor Q1 is connected to a center tap T of winding 40, and center tap T has two turns of primary winding 40 on either side of it.

On the other half cycle of the modulator 16, when the left side of the modulator (diodes CR1, CR2, resistors R1, R3) is at a positive voltage, the top two diodes CR1 and CR3 are forward biased and the bottom two diodes CR2 and CR4 are back biased, point P of primary winding 40 is effectively tied to plus seven volts, and the current source transistor Q1 draws current downwards through the top (point p) of primary winding 40.

Current source transistor Q1 has its base B connected to the output of operational amplifier 44 which drives the base B of transistor Q1. Operational amplifier 44 preferably is commercially available operational amplifier part no. CA3240. Operational amplifier 44, together with resistors R5, R6, R7 and R8 (each preferably 10K ohms) is a conventional differential amplifier which acts as a voltage to current converter 10 (see FIG. 1) in conjunction with transistor Q1, converting voltage changes in the analog input signal to changes in current levels as shown at $i_p$. The differential amplifier including operational amplifier 44 forces a voltage across resistor R9 equal to the changes in the input analog signal voltage. The differential amplifier is responsive to the difference in voltages between the analog input signal and ground, or alternatively circuit common. Thus if a voltage is applied to the analog signal input, the transistor Q1 pushes a current through resistor R9 to make the voltage of resistor R9 equal to the input voltage of the analog input signal. The current pushed by the emitter E of transistor Q1 flows through the collector C of transistor Q1 diminished by the current gain alpha of transistor Q1 and so transistor Q1 acts as a current source. Thus the differential amplifier circuit including operational amplifier 44 and resistors R5, R6, R7, R8, and R9 plus transistor Q1 are a feedback system that generates a precise current, that follows the analog input signal. Preemphasis filter 12 (preferably an RC filter) is connected to R9 as shown.

Also shown in FIG. 2 is the conventional precision rectifier 20 of FIG. 1, which includes capacitor C1 (preferably 1 $\mu$F), resistors R10, R11, R12 and R13 (each preferably 1K ohms), diodes CR5, CR6, and operational amplifiers 46, 48 each of which are preferably commercially available operational amplifiers part no. CA3450. The precision rectifier including operational amplifiers 46, 48 receives the squarewave current signals which are induced by primary winding 40 on the secondary winding 42.

The precision rectifier converts these squarewave signals into analog D.C. signals thus recovering the information in the analog input signal provided to operational amplifier 44.

The output terminal of operational amplifier 48 is connected to the conventional spike filter 50 which is preferably a nonlinear low pass filter for filtering out high frequencies. The output of spike filter 50 is provided to the deemphasis filter 22. Deemphasis filter 22 is preferably a conventional RC filter which progressively attenuates, versus frequency, signals whose frequency exceeds a few KHz.

Thus an analog output signal is output by deemphasis filter 22, and this output signal accurately replicates the analog input signal to the differential amplifier 44. The above described circuit provides electrical isolation between the input terminals of operational amplifier 44 and the output terminals of deemphasis filter 22 of 10K volts.

Figures 3, 3A:
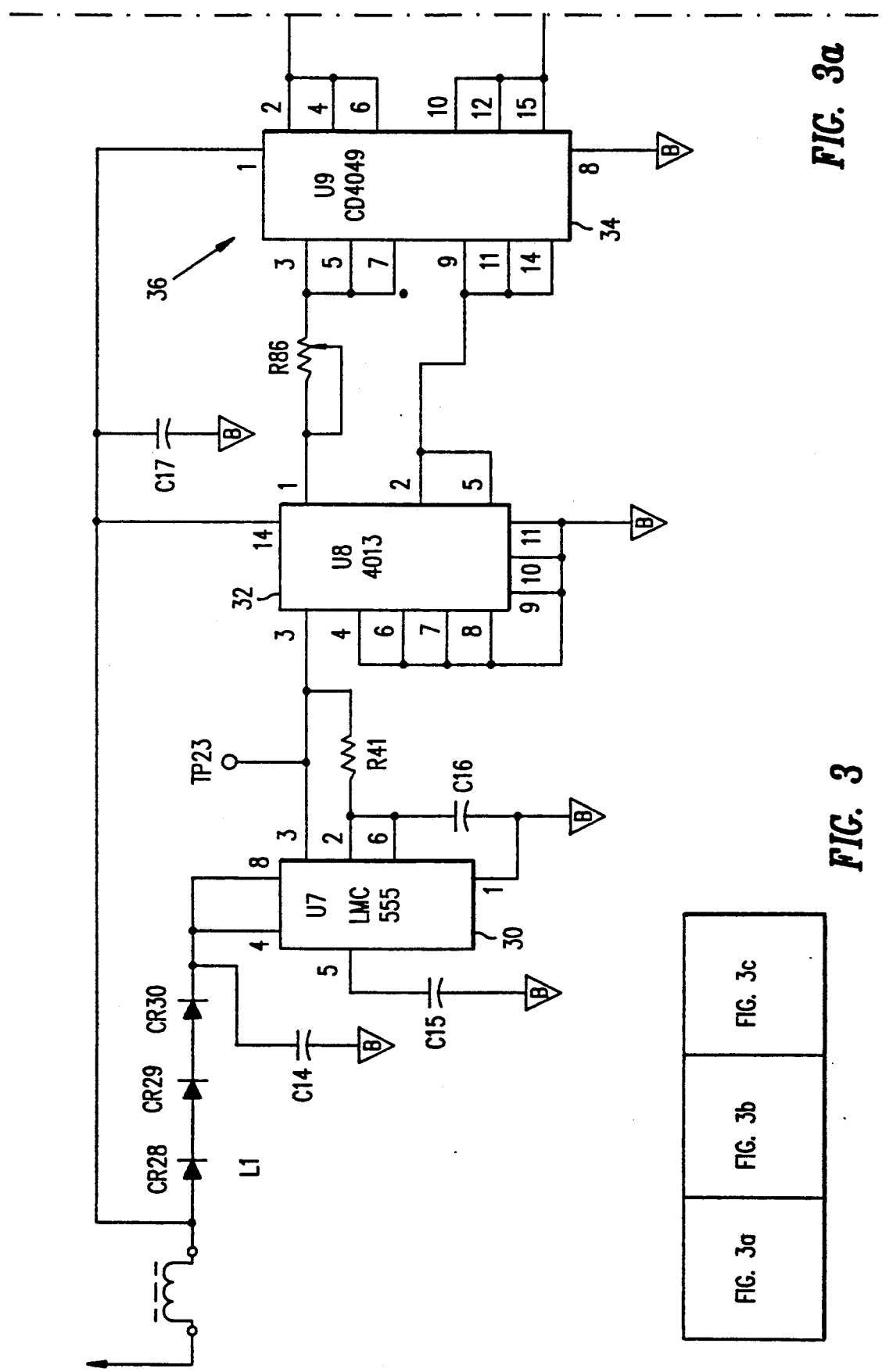
FIGS. 3, 3a, 3b and 3c show a detailed schematic of the preferred embodiment of the present invention as used in a laser power supply.
Figure 3B:
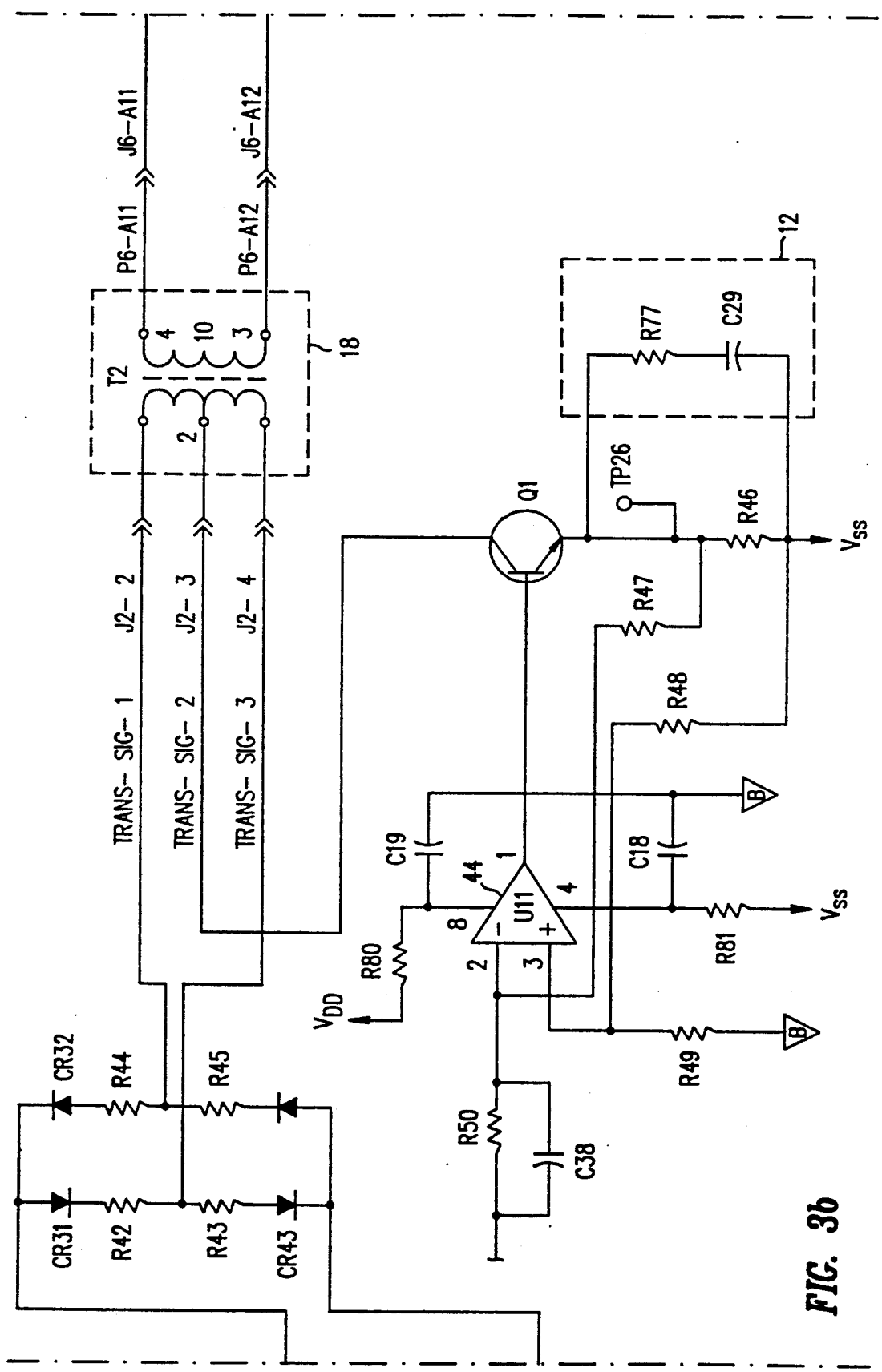
Figure 3C:
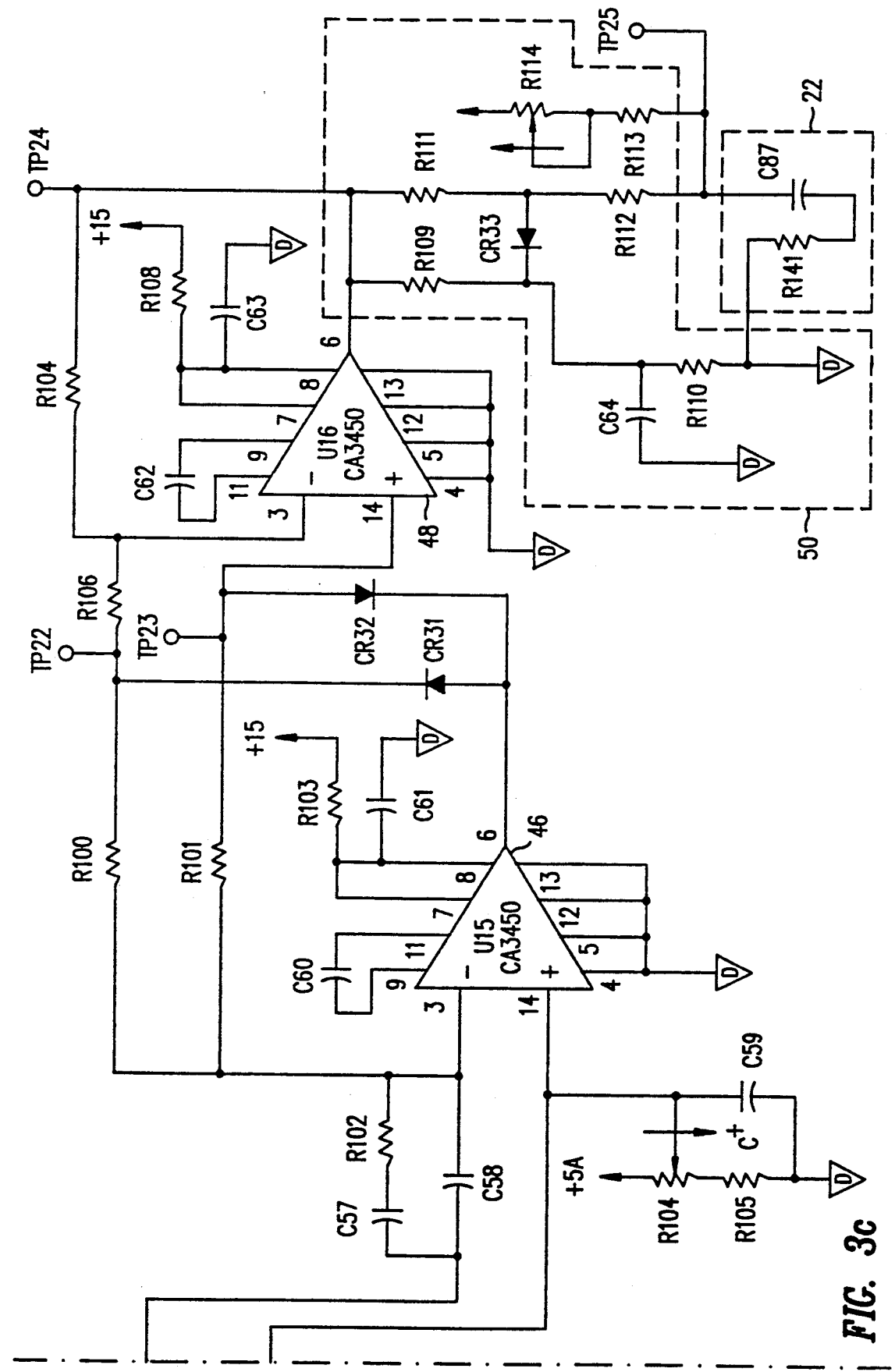

FIG. 3 shows a detailed schematic of the preferred embodiment of the invention as used in a laser power supply. Shown are oscillator 30, countdown device 32, power inverters 34 and 36, operational amplifier 44, preemphasis filter 12, transformer 18, transistor Q1, operational amplifiers 46 and 48, spike filter 50, and deemphasis filter 22.

Further embodiments of the invention use other known kinds of transformer primary winding current switching methods, with or without a primary winding center tap. Other embodiments use other kinds of rectifiers on the output side of the transformer in place of the above described precision rectifier. The preemphasis and deemphasis filters are not included in another embodiment.

In yet another embodiment, the source of the square waves is on the output side of the transformer. This embodiment uses two transformers, with the modulator on the input side of the transformer. Since in this embodiment the switching points of the square wave can be caused to occur at time points where, in a switching power supply, the pulse width modulator would never have to make a ramp comparison, no filtering would be needed.

This embodiment is shown in FIG. 4, whereby an analog input signal is amplified by conventional two stage amplifier 60 which is connected to current source transistor Q3 (an FET in this embodiment). Current source transistor Q3 is connected to conventional diode bridge 16. In this embodiment the square wave generator 14 is located on the output side of the circuit, and square wave generator 14 provides power and timing signals to diode bridge 16 by means of transformer 62, which serves as an input-output electrical isolator. Transformer 62 is preferably a one-to-one transformer.

In this embodiment, diode bridge 16 is synchronized by timing signals from switching power supply (S.P.S.) 64, whose chief function is providing power. Switching power supply 64 provides timing signals to square wave generator 14 at the same frequency or alternatively at a desired submultiple (i.e., ½, ⅓, ¼, etc.) of the switching power supply 64 operating frequency.

Diode bridge 16 provides the modulated input signal to a second transformer 66 (also preferably a one-to-one transformer). Second transformer 66 serves as an electrical isolator and provides the modulated input signal to precision rectifier 20 which recovers the input analog signal and provides the analog output signal.

This embodiment differs from the preferred embodiment, in synchronizing the square wave generator 14 to the switching power supply 64. In order to do this, square wave generator 14 is located on the output side of the circuit and is connected to diode bridge 16 by transformer 62. as described above.

This circuit operates by switching the diode bridge 16 in synchronization with the switching power supply 64 so that the transitions in the square wave of the diode bridge 16 are at unimportant times in the switching power supply 64 cycle, i.e., those times when a voltage ramp comparison by the switching power supply 64 is not likely to be made.

The above description of the invention is illustrative and not limiting. Further embodiments will be obvious in light of the teachings of the invention.

I claim:

1. An information channel having an input terminal and an output terminal comprising:
transformer means for providing electrical isolation connected between the input terminal and the output terminal;
a precision rectifier having amplification connected between the transformer means and the output terminal for recovering the input signal; and
square wave modulating means connected to the transformer means for modulating by a square wave a signal provided to the input terminal.

2. The device of claim 1, further comprising voltage to current converter means connected between the input terminal and the transformer means for converting the signal provided to the input terminal to a current proportional to the input signal.

3. The device of claim 2, wherein the converter means is connected to center tap of a primary winding of the transformer means.

4. The device of claim 1, wherein the modulating means comprises:
square wave generator means for generating a square wave; and
modulator means for modulating the signal.

5. The device of claim 4, wherein the square wave generator means comprises:
oscillator means for providing a clock signal; and
countdown means for generating a square wave driven by the clock signal of the oscillator means.

6. The device of claim 2, wherein the converter means comprises;
a differential amplifier; and
a transistor driven by an output of the differential amplifier.

7. The device of claim 1, further comprising:
preemphasis filter means connected to the transformer means for preemphasizing the signal provided to the input terminal; and
deemphasis filter means connected to the output terminal for deemphasizing a signal provided from the transformer means to the output terminal.

8. The device of claim 4, wherein the modulator means comprises a diode bridge.

9. An information channel comprising:
an input terminal for receiving an input signal;
an output terminal for transmitting an output signal;
voltage to current converter means connected to the input terminal for converting a voltage of the input signal to a current proportional to the voltage and having an output terminal;
transformer means for providing electrical isolation between the input and output terminals, having at least a primary and a secondary winding, the primary winding having a center tap connected to the output terminal of the converter means;
square wave modulating means connected to the primary winding for providing a square wave modulation of the input signal;
means for synchronizing the square wave modulating means to a frequency of a switching power supply; and
rectifier means connected to the secondary winding and connected to the output terminal, for rectifying a signal in the secondary winding induced by a signal in the primary winding and providing the rectified signal to the output terminal.

10. The information channel of claim 9, wherein the square wave modulating means comprises second transformer means for providing electrical isolation.

11. The information channel of claim 9, wherein the means for synchronizing causes the square wave modulating means to operate at a frequency that is a submultiple of the frequency of the switching power supply.

12. A method for transmitting a signal comprising the steps of:

coverting an input signal into a current proportional to the input signal;

modulating the current by a square wave;

providing the modulated current to a primary winding of a transformer; and rectifying a signal induced by the modulated current on a secondary winding of the transformer without distortion by use of amplification.

13. The information channel of claim 9, wherein the rectifier means comprises a precision rectifier having amplification for rectifying the signal without distortion.

14. An information channel having an input terminal and an output terminal comprising:

transformer means for providing electrical isolation connected between the input terminal and the output terminal;

square wave modulating means connected to the transformer means for modulating by a square wave a signal provided to the input terminal;

preemphasis filter means connected to the transformer means for preemphasizing the signal provided to the input terminal; and deemphasis filter means connected to the output terminal for deemphasizing a signal provided by the transformer means to the output terminal.

15. An information channel comprising:

an input terminal for receiving an input signal;

an output terminal for transmitting an output signal;

voltage to current converter means connected to the input terminal for converting a voltage of the input signal to a current proportional to the voltage and having an output terminal;

transformer means for providing electrical isolation between the input and output terminals, having at least a primary and a secondary winding, the primary winding having a center tap connected to the output terminal of converter means;

square wave modulating means connected to the primary winding for providing a square wave modulation of the input signal, wherein the square wave modulating means includes second transformer means for providing electrical isolation; and rectifier means connected to the secondary winding and connected to the output terminal, for rectifying a signal in the secondary winding induced by a signal in the primary winding and providing the rectified signal to the output terminal.

16. An information channel comprising:

an input terminal for receiving an input signal;

an output terminal for transmitting an output signal;

voltage to current converter means connected to the input terminal for converting a voltage of the input signal to a current proportional to the voltage and having an output terminal;

transformer means for providing electrical isolation between the input and output terminals, having at least a primary and a secondary winding, the primary winding having a center tap connected to the output terminal of the converter means;

square wave modulating means connected to the primary winding for providing a square wave modulation of the input signal; and rectifier means connected to the secondary winding and connected to the output terminal, for rectifying a signal in the secondary winding induced by a signal in the primary winding and providing the rectified signal to the output terminal, and including a precision rectifier having amplification for rectifying the signal without distortion.

17. An information channel having an input terminal and an output terminal comprising:

a current transformer for providing electrical isolation and connected between the input terminal and the output terminal;

square wave modulating means connected to the transformer for modulating by a square wave a signal provided to the input terminal; and wherein an impedance connected to a winding of the transformer which is connected to the input terminal is substantially higher than an impedance connected to a winding of the transformer which is connected to the output terminal.

* * * * *